United States Patent
Kim

(10) Patent No.: US 11,349,109 B2
(45) Date of Patent: May 31, 2022

(54) DISPLAY PANEL COMPRISING AN INCLINED SURFACE

(71) Applicant: SAMSUNG DISPLAY CO., LTD., Yongin-si (KR)

(72) Inventor: Kwangnyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 33 days.

(21) Appl. No.: 16/779,505

(22) Filed: Jan. 31, 2020

(65) Prior Publication Data
US 2020/0176723 A1  Jun. 4, 2020

Related U.S. Application Data

(62) Division of application No. 15/658,768, filed on Jul. 25, 2017, now Pat. No. 10,553,831.

(30) Foreign Application Priority Data

Oct. 7, 2016  (KR) ......................... 10-2016-0129875

(51) Int. Cl.
*H01L 51/52* (2006.01)
*H01L 33/50* (2010.01)
*H01L 27/32* (2006.01)
(Continued)

(52) U.S. Cl.
CPC .......... *H01L 51/56* (2013.01); *H01L 21/6838* (2013.01); *H01L 27/3232* (2013.01);
(Continued)

(58) Field of Classification Search
CPC . H01L 21/67092; H01L 21/78; H01L 33/505; H01L 51/0097; H01L 51/5253;
(Continued)

(56) References Cited

U.S. PATENT DOCUMENTS

| 8,841,150 B2 | 9/2014 | Kim et al. |
| 2007/0259589 A1 | 11/2007 | Izumi et al. |

(Continued)

FOREIGN PATENT DOCUMENTS

| KR | 10-2013-0045749 A | 5/2013 |
| KR | 10-2014-0009920 A | 1/2014 |

(Continued)

*Primary Examiner* — Eduardo A Rodela
*Assistant Examiner* — Christopher M Roland
(74) *Attorney, Agent, or Firm* — Lewis Roca Rothgerber Christie LLP

(57) ABSTRACT

A method of manufacturing a display apparatus includes preparing a panel with a panel layer displaying images, a first protection film on a first surface of the panel layer with a first adhesion layer, and a second protection film on a second surface of the panel layer with a second adhesion layer, disposing the panel on a stage, cutting the panel on the stage along a closed-curve line to a predetermined depth extending from the second protection film to at least a portion of the first adhesion layer, and separating a first portion of the panel inside the closed-curve line from a second portion of the panel outside the closed-curve line, such that the second portion is removed simultaneously with the entire first protection film according to a first boundary by the line and a second boundary between the panel layer and the first protection film.

8 Claims, 7 Drawing Sheets

(51) Int. Cl.
*H01L 51/56* (2006.01)
*H01L 21/683* (2006.01)
*H01L 51/00* (2006.01)
*H01L 21/78* (2006.01)

(52) U.S. Cl.
CPC ........ *H01L 33/505* (2013.01); *H01L 51/0097* (2013.01); *H01L 51/5253* (2013.01); *H01L 51/5293* (2013.01); *H01L 21/78* (2013.01); *H01L 27/3244* (2013.01); *H01L 33/50* (2013.01); *H01L 33/507* (2013.01); *H01L 51/5281* (2013.01); *H01L 2227/323* (2013.01); *H01L 2251/5338* (2013.01); *H01L 2251/566* (2013.01)

(58) Field of Classification Search
CPC ................. H01L 51/5293; H01L 51/56; H01L 2251/5338; H01L 2251/566
See application file for complete search history.

(56) References Cited

U.S. PATENT DOCUMENTS

| | | |
|---|---|---|
| 2013/0153554 A1 | 6/2013 | Duerr et al. |
| 2014/0017967 A1 | 1/2014 | Kim et al. |
| 2015/0179722 A1 | 6/2015 | Koo et al. |
| 2016/0129527 A1 | 5/2016 | Moon et al. |
| 2016/0147109 A1* | 5/2016 | Yamazaki ........... H01L 51/5246 349/42 |
| 2017/0210115 A1 | 7/2017 | Ohno et al. |
| 2017/0358781 A1* | 12/2017 | Kang ................. H01L 27/1248 |

FOREIGN PATENT DOCUMENTS

| | | |
|---|---|---|
| KR | 10-2014-0045837 A | 4/2014 |
| KR | 10-2015-0016800 A | 2/2015 |
| KR | 10-2016-0056464 A | 5/2016 |

* cited by examiner

DISPLAY PANEL COMPRISING AN INCLINED SURFACE

CROSS-REFERENCE TO RELATED APPLICATION

This application is a divisional of U.S. patent application Ser. No. 15/658,768, filed Jul. 25, 2017, which claims priority to and the benefit of Korean Patent Application No. 10-2016-0129875, filed Oct. 7, 2016, the entire content of both of which is incorporated herein by reference.

BACKGROUND

1. Field

One or more embodiments relate to display apparatuses and methods of manufacturing the display apparatuses, and more particularly, to flexible display apparatuses with respect to which a process of cutting a rim of a flexible panel is improved to cut the flexible panel to a desired shape and methods of manufacturing the same.

2. Description of the Related Art

Generally, a flexible display apparatus is an apparatus having flexibility by forming a device layer for producing an image on a flexible substrate, and has an advantage in that the flexible display apparatus may be bent if necessary. When the flexible display apparatus is manufactured, a rim of a flexible panel is cut to a desired specification and shape, e.g., a round corner shape.

SUMMARY

One or more embodiments include display apparatuses with respect to which a process of cutting a rim of a flexible panel is improved to cut the panel to a desired shape and methods of manufacturing the same.

According to one or more embodiments, a method of manufacturing a display apparatus includes, preparing a panel, such that the panel includes a panel layer to display an image, a first protection film attached to a first surface of the panel layer with a first adhesion layer, and a second protection film attached to a second surface of the panel layer with a second adhesion layer, disposing the panel on a stage, such that the stage faces the first protection film, cutting the panel on the stage along a closed-curve cutting line to a predetermined depth, the predetermined depth extending from the second protection film to at least a portion of the first adhesion layer, and separating a first portion of the panel inside the closed-curve cutting line from a second portion of the panel outside the closed-curve cutting line, such that the second portion is removed simultaneously with the entire first protection film according to a first boundary by the cutting line and a second boundary between the panel layer and the first protection film.

The inside region of the closed-curve cutting line may include a display unit on which an image is displayed, and the outside region of the closed-curve cutting line may include a dummy unit which is a non-display region.

The cutting of the flexible panel may include irradiating a laser along the closed-curve cutting line from a side of the second protection film.

A cutting groove formed by the laser may have a space gradually reducing towards the first adhesion layer from the second protection film.

The laser may include one of a $CO_2$ laser, a green laser, an infrared ray laser, and an ultraviolet ray laser.

The disposing of the flexible panel disposed on the stage may include tightly fixing the flexible panel on the stage.

The stage may include a suction hole, and the fixing of the flexible panel on the stage may include attaching the flexible panel to the stage by applying suction force to the flexible panel through the suction hole.

The method may further include forming a polarizing layer on the panel layer of the inside region of the closed-curve cutting line from which the first protection film is removed.

The polarizing layer may include a polarizing film to be attached to the panel layer.

The cutting of the flexible panel on the stage may include forming the flexible panel with an edge having an inclined shape in which a width is gradually increased, and forming the polarizing layer may include forming the polarizing layer with a straight edge perpendicular to a top surface of the panel layer.

The closed-curve cutting line may have a rectangular shape having round corners.

The closed-curve cutting line may have a shape in which a rectangular shape is attached to a side of a circle.

The panel layer may include an organic light-emitting diode.

According to one or more embodiments, a display apparatus includes a panel including a panel layer to display an image, a protection film on a first surface of the panel layer, and a polarizing layer on a second surface of the panel layer, the first and second surfaces being opposite, wherein an edge of the panel layer is inclined at a predetermined angle with respect to an imaginary line, the imaginary line extending along a normal to the polarizing layer.

The flexible panel may have an edge having an inclined shape in which a width is gradually increased from the protection film towards the polarizing layer.

A width of the flexible panel may be gradually increased from the protection film to the panel layer, and the panel layer and the polarizing layer may have the same width.

An adhesion layer may be disposed between the protection film and the panel layer.

The polarizing layer may include a polarizing film to be attached to the panel layer.

The polarizing film may be directly on the flexible panel.

The flexible panel may have an inclined edge, and the polarizing film may have a straight edge perpendicular to the top surface of the panel layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
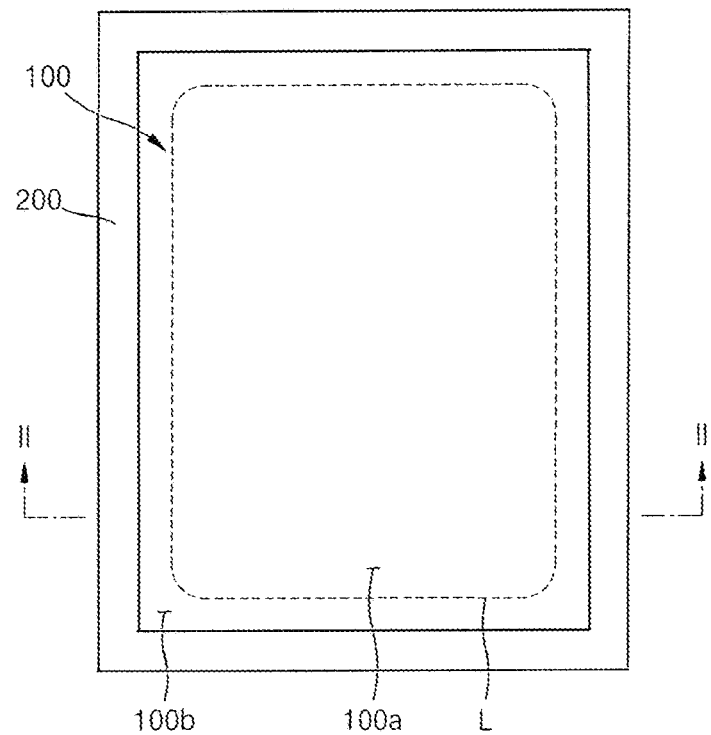
FIG. 1 illustrates a plan view of a flexible panel of a flexible display apparatus seated on a stage for cutting the flexible panel to a desired shape according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In the following embodiments, the singular forms include the plural forms unless the context clearly indicates otherwise. Further, in the following embodiments, it will be understood that the terms "comprise" and/or "comprising," when used in this specification, specify the presence of stated features, and/or components, but do not preclude the presence or addition of one or more other features, and/or components, and/or groups thereof.

When a certain embodiment may be implemented differently, a specific process order may be performed differently from the described order. For example, two consecutively described processes may be performed substantially at the same time or performed in an order opposite to the described order.

Figure 2:
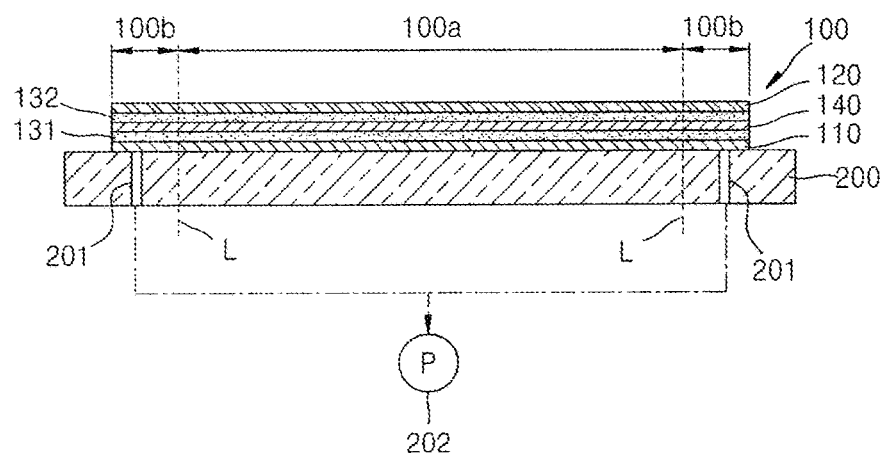
FIG. 2 illustrates a cross-sectional view taken along line II-II of FIG. 1.

FIG. 1 is a plan view of a flexible panel 100 of a flexible display apparatus seated on a stage 200 for cutting the flexible panel 100 to a desired shape according to an example embodiment. FIG. 2 is a cross-sectional view taken along line II-II of FIG. 1.

Generally, a flexible display apparatus may have a structure including the flexible panel 100 having flexibility and a housing that supports the flexible panel 100. Here, a process of cutting a rim of the flexible panel 100 to a desired size and shape will be described.

Referring to FIG. 1, it is assumed that the flexible panel 100 on the stage 200 is cut out along a closed-curve cutting line L having a rectangular shape with rounded corners. A region outside the closed-curve cutting line L to be cut off may be a dummy unit 100b, i.e., a region which is a non-display region, and the remaining region inside the closed-curve cutting line L may be a display unit 100a, i.e., the desired product.

Referring to FIG. 2, for a cutting operation, the flexible panel 100 is fixed on the stage 200. To do so, the stage 200 includes a suction hole 201 connected to a suction pump 202, e.g., a vacuum pump. Accordingly, when suction force is applied to the suction hole 201 by operating the suction pump 202, the flexible panel 100 is attached to and fixed on the stage 200 due to negative pressure.

As illustrated in FIG. 2, the flexible panel 100 may include a panel layer 140, on which an image is produced, and first and second protection films 110 and 120 on respective opposite surfaces of the panel layer 140. The first and second protection films 110 and 120 are attached to the opposite surfaces of the panel layer 140 with first and second adhesion layers 131 and 132, respectively. In other words, the first adhesion layer 131 is between the first protection film 110 and the panel layer 140, and the second adhesion layer 132 is between the second protection film 120 and the panel layer 140.

When the flexible panel 100 is fixed on the stage 200, the first protection film 110 is disposed facing the stage 200 and attached, e.g., directly, to the stage 200, and the second protection film 120 may define an outermost upper surface of the flexible panel 100. Accordingly, when the flexible panel 100 is cut, e.g., with a laser, the cutting is performed on a side of the second protection film 120 opposite to the first protection film 110, as will be described in more detail below.

A method of manufacturing the flexible panel 100 including the cutting process will be described below in detail. Prior to describing the manufacturing method, an internal structure of the panel layer 140 will be described with reference to FIG. 7.

Figure 7:
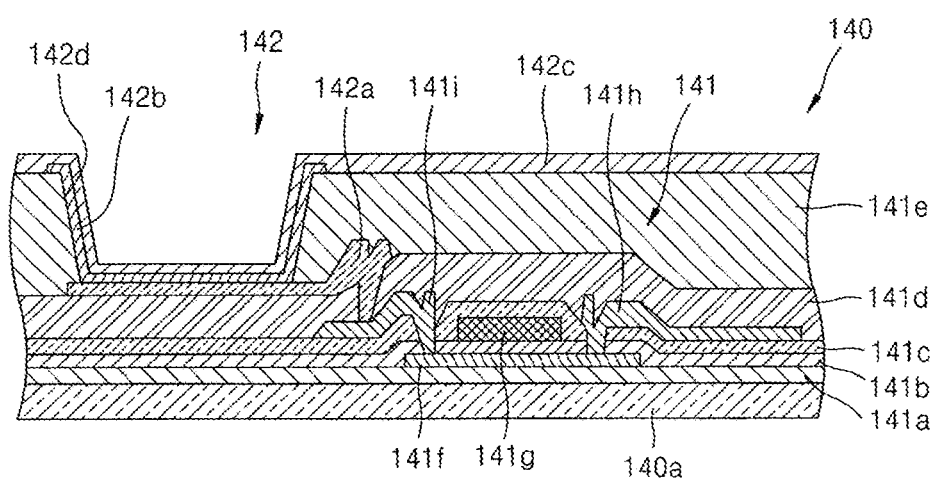
FIG. 7 illustrates a cross-sectional view showing an inner structure of a display unit of the flexible panel of FIG. 1.

Referring to FIG. 7, the panel layer 140 may include a thin film transistor (TFT) 141 and an organic light-emitting diode 142. In detail, an active layer 141f may be formed on a buffer layer 141a, which is positioned on a flexible substrate 140a, and the active layer 141f may include a source region and a drain region, on which an N-type or a P-type dopant is highly doped. The active layer 141f may include an oxide semiconductor. For example, the oxide semiconductor may include a metal element, e.g., Zn, In, Ga, Sn, Cd, Ge, or Hf of Groups 12, 13, and 14, and an oxide of the metal element. For example, the active layer 141f may include G-I—Z—O[$(In_2O_3)a(Ga_2O_3)b(ZnO)c$] (where a, b, and c are integers respectively satisfying a≥0, b≥0, and c>0). A gate electrode 141g may be formed above the active layer 141f with a gate insulating film 141b therebetween. A source electrode 141h and a drain electrode 141i are formed above the active layer 141f. An interlayer insulating film 141c is formed between the gate electrode 141g and the source and drain electrodes 141h and 141i. A passivation film 141d may be formed between the source and drain electrodes 141h and 141i and an anode electrode 142a of the organic light-emitting diode 142.

An insulating planarization film 141e may be formed on the anode electrode 142a, and the organic light-emitting diode 142 may be formed in the insulating planarization film 141e after forming a predetermined opening 142d in the insulating planarization film 141e. The insulating planarization film 141e may include, e.g., acryl.

The organic light-emitting diode 142 displays predetermined image information by emitting red, green, and blue light. The organic light-emitting diode 142 may include the anode electrode 142a that is connected to the drain electrode 141i of the TFT 141 to receive positive power from the drain electrode 141i of the TFT 141, a cathode electrode 142c that covers all pixels and supplies negative power to the whole pixels, and an emission layer 142b between the anode electrode 142a and the cathode electrode 142c and emitting light. A hole injection layer (HIL), a hole transport layer (HTL), an electron transport layer (ETL), and an electron injection layer (EIL) may be stacked adjacent to the emission layer 142b.

For reference, each pixel may include the emission layer 142b and three pixels that respectively may emit red, green, and blue light may form a unit pixel. Also, an emission layer may be commonly formed on all the pixel regions regardless of the locations of the pixels. At this point, the emission layer 142b may be formed by vertically stacking or combining layers that include light-emitting materials that emit red, green, and blue light. If white light is emitted, a combination of other light colors is also possible. Also, a color conversion layer or a color filter that converts the emitted white light to a predetermined color may be included.

The emission layer 142b may be susceptible to moisture. Thus, the emission layer 142b may be protected by forming a thin film encapsulating layer on the cathode electrode 142c. The thin film encapsulating layer may be formed by alternately stacking organic films and inorganic films.

A process of cutting a rim of the flexible panel 100 having the panel layer 140 may be performed as follows.

Figure 3A:
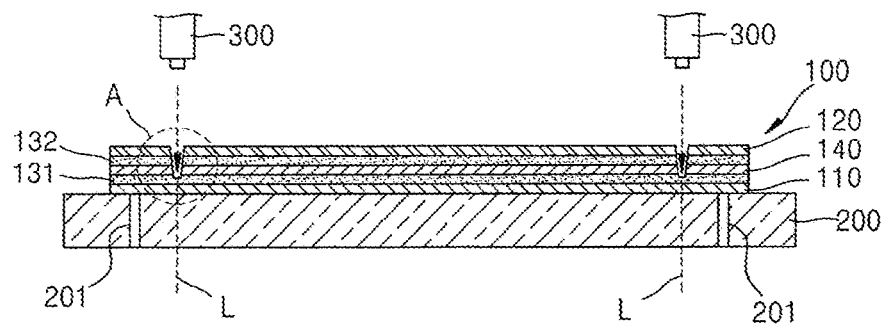
FIG. 3A illustrates a cross-sectional view showing a process of laser cutting the flexible panel of FIG. 2 along a cutting line according to an example embodiment.
Figure 3B:
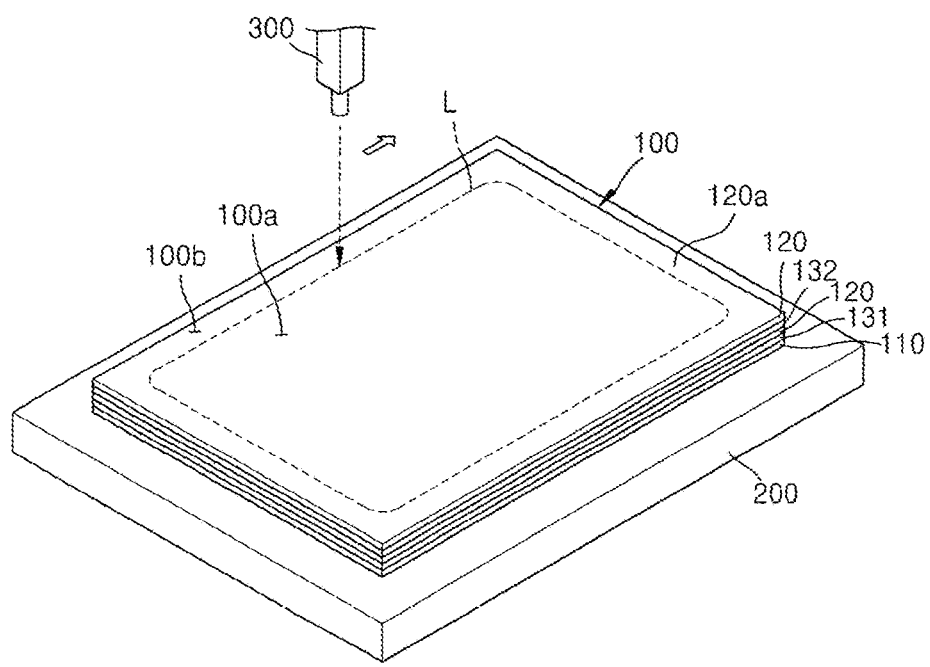
FIG. 3B illustrates a perspective view of the flexible panel in FIG. 3A.

First, as illustrated in FIGS. 3A and 3B, the flexible panel 100 is fixed on the stage 200 by suction, e.g., adsorbing the flexible panel 100 to the stage 200, with an upper surface 120a of the second protection film 120 defining the outermost upper surface of the flexible panel 100. Next, a laser is irradiated onto a side of the second protection film 120 of the flexible panel 100 while moving a laser irradiator 300 along the closed-curve cutting line L. That is, the laser is, e.g., continuously, irradiated onto the upper surface 120a of the second protection film 120, while the laser irradiator 300 moves along the closed-curve cutting line L, as illustrated in FIG. 3B.

Figure 3C:
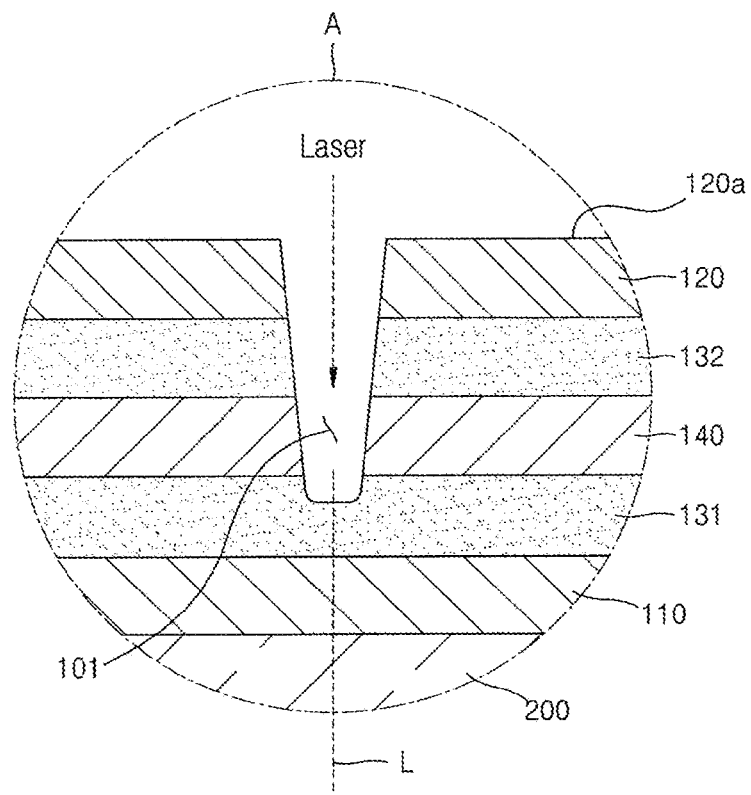
FIG. 3C illustrates a magnified view of a region A of FIG. 3A.

Then, as illustrated in FIGS. 3A and 3C, a cutting groove 101 may be formed in the flexible panel 100 along the closed-curve cutting line L as a result of the laser irradiation onto the second protection film 120. At this point, the strength of the laser is controlled, e.g., adjusted, so that a depth of the cutting groove 101 is not deeper than the first adhesion layer 131, e.g., from the upper surface 120a of the second protection film 120. For example, as illustrated in FIG. 3C, the cutting groove 101 extends, e.g., continuously, through the second protection film 120, the second adhesion layer 132, the panel layer 140, and at least partially through the first adhesion layer 131, without reaching the first protection film 110.

The cutting groove 101 does not reach the first protection film 110, as the first protection film 110 may be removed together with the dummy unit 100b, i.e., a portion of the flexible panel 100 outside the closed-curve cutting line L, as will be discussed in detail with reference to FIGS. 4A-4B below. As the cutting groove 101 does not extend into the first protection film 110, operation time for the laser irradiator 300 is minimized, i.e., as time for cutting the first protection film 110 is eliminated, and risk of generating a contamination material is reduced. Further, a risk of damaging the stage 200 beyond the first protection film 110 is prevented or substantially minimized.

Referring back to FIG. 3C, the cutting groove 101 formed by the laser may have a gradually reduced width toward an inner side from the outer side of the cutting groove 101, e.g., a width of the cutting groove 101 in the second protection film 120 is larger than a width of the cutting groove 101 in the panel layer 140. For example, the laser may be any one of a $CO_2$ laser, a green laser, an infrared ray laser, and an ultraviolet ray laser.

Figure 4A:
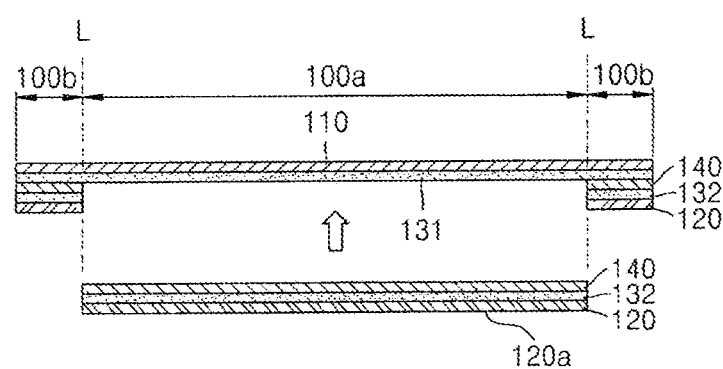
FIG. 4A illustrates a cross-sectional view showing a process of removing a dummy unit of the flexible panel that is cut in FIG. 3A together with a protection film.
Figure 4B:
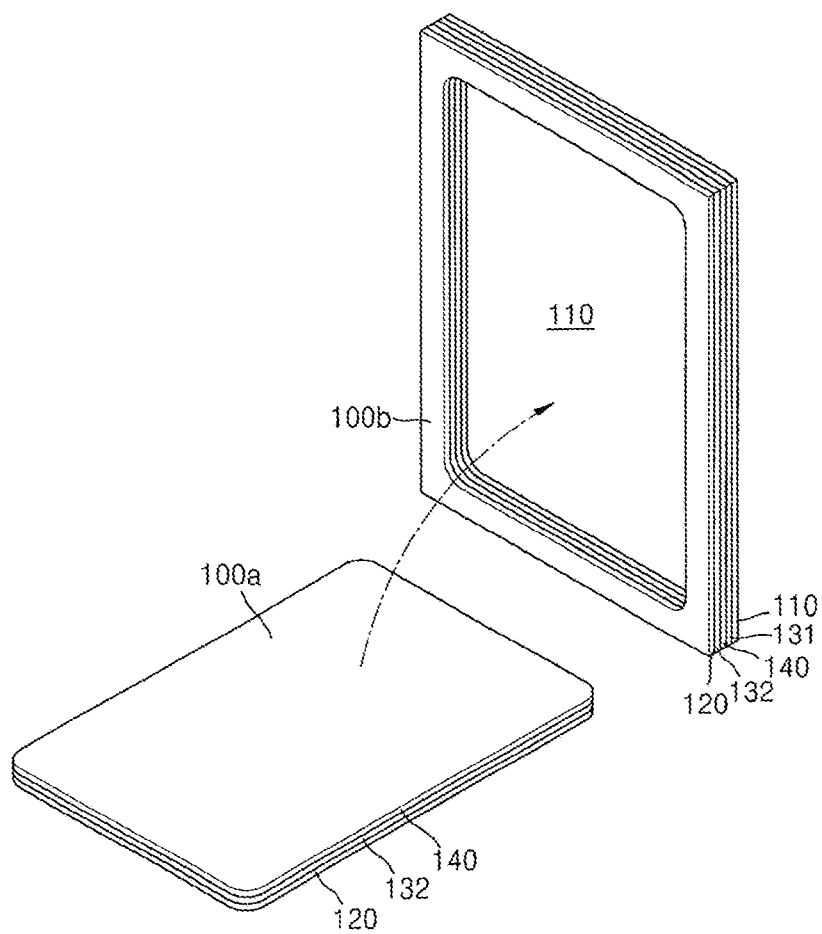
FIG. 4B illustrates a perspective view of the resultant product of FIG. 4A.

Next, after forming the cutting groove 101 along the closed-curve cutting line L, the display unit 100a, i.e., a portion inside the closed-curve cutting line L, and the dummy unit 100b, a portion outside the closed-curve cutting line L, are separated from each other, as illustrated in FIGS. 4A-4B. That is, after cutting the flexible panel 100 in a desired shape along the closed-curve cutting line L, the unnecessary outer rim is separated, e.g., removed.

At this point, as illustrated in FIGS. 4A and 4B, the first protection film 110 of the display unit 100a is simultaneously separated together with the dummy unit 100b. That is, since the cutting groove 101 is formed by laser cutting, the display unit 100a inside the closed-curve cutting line L and the dummy unit 100b outside the closed-curve cutting line L are connected to each other by only the first protection film 110. Thus, when the first protection film 110 is removed, e.g., pulled away, the dummy unit 100b outside the closed-curve cutting line L may also be removed, e.g., pulled away, together with the first protection film 110. Accordingly, the dummy unit 100b and the first protection film 110 are simultaneously removed in a single process.

Figure 5A:
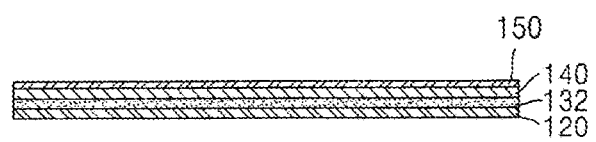
FIG. 5A illustrates a cross-sectional view of the flexible panel separated in FIG. 4A on which a polarizing layer is formed.
Figure 5B:
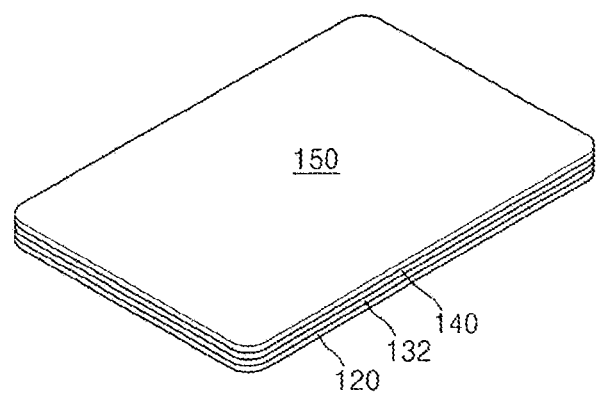
FIG. 5B illustrates a perspective view of the resultant product of FIG. 5A.

Next, as illustrated in FIGS. 5A and 5B, a polarizing layer 150 is formed on the panel layer 140 from which the first protection film 110 is removed, e.g., the polarizing layer 150 may be attached to a surface of the panel layer 140 including remains of the first adhesive layer 131. The polarizing layer 150 may be formed, e.g., by attaching a polarizing film to the panel layer 140. When the display unit 100a of the flexible panel 100 is installed on a housing, the manufacturing of a flexible display apparatus is completed.

Figure 5C:
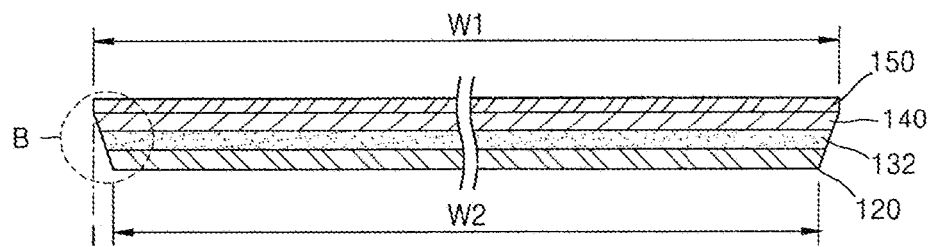
FIG. 5C illustrates a magnified cross-sectional view of both edges of FIG. 5A.

When both edges of the flexible panel 100, on which the polarizing layer 150 is formed, are magnified, as illustrated in FIG. 5C, the flexible panel 100 has an inclination structure in which a width of the flexible panel 100 is gradually increased from the second protection film 120 toward the polarizing layer 150. This is because the cutting groove 101 has a shape in which a space thereof is gradually reduced from the second protection film 120 due to the laser cutting, and thus, the edge of the flexible panel 100 has an inclination shape as depicted in FIG. 5C after removing the dummy unit 100b. Accordingly, a width W1 of the polarizing layer 150 is greater than a width W2 of the second protection film 120. In detail, an inclination shape is formed from the second protection film 120, in which the cutting groove 101 is formed by a laser, to the panel layer 140, and the polarizing layer 150 has the same size as the panel layer 140.

Figure 5D:
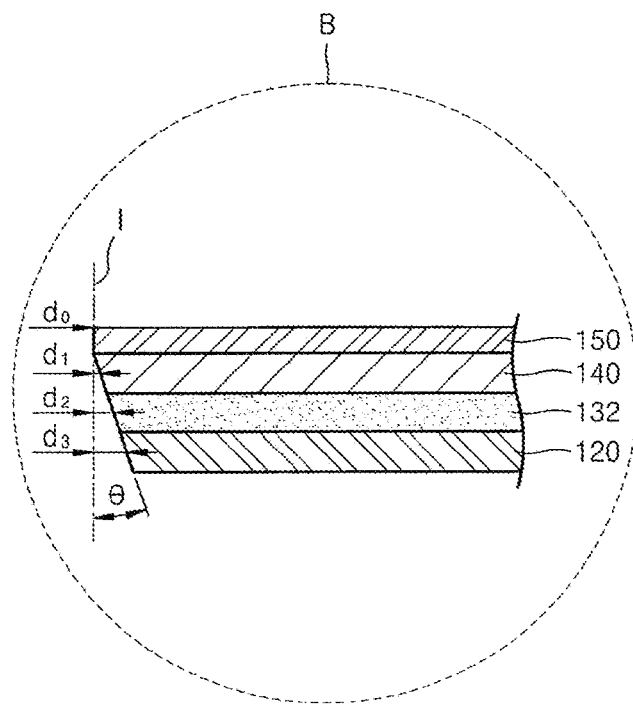
FIG. 5D illustrates a magnified cross-sectional view of a region B in FIG. 5C.

In other words, as illustrated in FIG. 5D, the inclination structure of the flexible panel 100 is gradually increased from the second protection film 120 toward the polarizing layer 150, e.g., along an angle θ. In detail, as the width of the flexible panel 100 is gradually increasing from the second protection film 120 toward the polarizing layer 150, a distance d3, i.e., a distance between an edge of the second protection film 120 and an imaginary line I, is larger than a distance d2, i.e., a distance between an edge of the second adhesion layer 132 and the imaginary line I. Similarly, the distance d2, i.e., a distance between an edge of the second adhesion layer 132 and the imaginary line I, is larger than a distance d1, i.e., a distance between an edge of the a panel layer 140 and the imaginary line I. The edges of the second protection film 120, the second adhesion layer 132, and the panel layer 140 facing the imaginary line I are collinear, so the angle θ is defined between the imaginary line I and the collinear edges. The imaginary line I is an imaginary line extending along a normal to the polarizing layer 150 at an edge of the polarizing layer 150, i.e., a distance d0 between the imaginary line I and the edge of the polarizing layer 150 is zero. For example, the imaginary line I may extend from the center of the bottom of the cutting groove.

When a flexible display apparatus is manufactured by using the method described above, cutting of the stage 200 on which the flexible panel 100 is disposed may be prevented. That is, if a cutting groove were to be formed through an entire thickness of a flexible panel, e.g., from a second protection film to a first protection film, by performing a cutting operation using a laser, a cutting line could have been formed in a stage supporting the flexible panel, e.g., along the closed-curve cutting line L, thereby damaging the stage.

However, in the method according to the current embodiment described above, the cutting groove 101 is formed only up to the first protection film 110. Thus, formation of a cutting line in the stage 200 is prevented, thereby preventing or substantially minimizing damage to the stage. Also, manufacturing costs may be minimized and production efficiency may be increased, as it is unnecessary to prepare an exclusive stage for each specification of a product, i.e., the same stage 200 may be used for all products regardless of the specifications.

Further, as described above, since the dummy unit 100b and the first protection film 110 may be simultaneously removed in a single process, the separation operation may be rapidly performed. Accordingly, when the method according to the current embodiment is used, productivity of the flexible display apparatus may be greatly increased.

Figure 6:
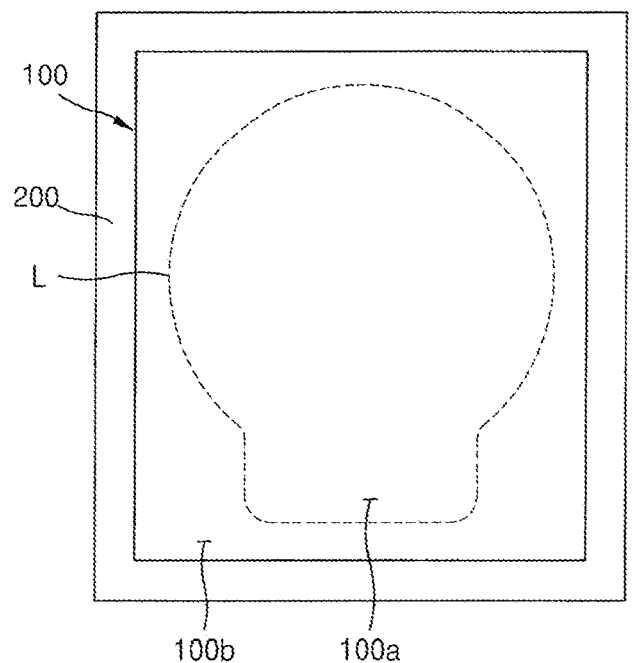
FIG. 6 illustrates a plan view showing an example of a modification of a cutting line of FIG. 1.

In the current example embodiment of the present disclosure, the closed-curve cutting line L has a rectangular shape with round corners. However, this is an example and may be modified in various ways. For example, as illustrated in FIG. 6, the shape of a closed-curve cutting line L may be a rectangle attached to a side of a circle.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
    a panel including a panel layer to display an image, a protection film on a first surface of the panel layer, and a polarizing layer on a second surface of the panel layer, the first and second surfaces being opposite to each other,
    wherein the panel has an edge surface inclined with respect to the first surface of the panel layer,
    a width of the panel gradually increases from the protection film toward the polarizing layer in a direction parallel to the first surface of the panel layer, and
    a width of a third surface of the protection film is greater than a width of a fourth surface of the protection film in the direction parallel to the first surface of the panel layer, the third surface of the protection film being close to the first surface of the panel layer, and the fourth surface of the protection film being opposite to the third surface of the protection film.

2. The display apparatus as claimed in claim 1, wherein the edge surface is inclined at a predetermined angle with respect to the first surface of the panel layer.

3. The display apparatus as claimed in claim 2, wherein a width of the second surface of the panel layer is greater than a width of the first surface of the panel layer, and
    the second surface of the panel layer and the polarizing layer have a same width.

4. The display apparatus as claimed in claim 1, further comprising an adhesion layer arranged between the third surface of the protection film and the first surface of the panel layer.

5. The display apparatus as claimed in claim 4, wherein a width of a surface of the adhesion layer close to the third surface of the protection film is less than a width of a surface of the adhesion layer close to the first surface of the panel layer.

6. The display apparatus as claimed in claim 1, wherein the polarizing layer is directly on the panel layer.

7. The display apparatus as claimed in claim 1, wherein a first surface of the polarizing layer close to the second surface of the panel layer and a second surface of the polarizing layer opposite to the first surface of the polarizing layer have a same width.

8. The display apparatus as claimed in claim 1, wherein the polarizing layer has a width greater than that of the protection film in the direction parallel to the first surface of the panel layer.

* * * * *